United States Patent
Tokuda

(10) Patent No.: US 11,750,153 B2
(45) Date of Patent: Sep. 5, 2023

(54) HIGH-FREQUENCY CIRCUIT

(71) Applicant: Murata Manufacturing Co., Ltd., Kyoto (JP)

(72) Inventor: Masamichi Tokuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 420 days.

(21) Appl. No.: 17/132,090

(22) Filed: Dec. 23, 2020

(65) Prior Publication Data
US 2021/0203283 A1 Jul. 1, 2021

(30) Foreign Application Priority Data

Dec. 26, 2019 (JP) .................... 2019-237083

(51) Int. Cl.
*H03F 3/19* (2006.01)
*H03F 1/56* (2006.01)
*H03F 1/02* (2006.01)

(52) U.S. Cl.
CPC ............. *H03F 3/19* (2013.01); *H03F 1/0211* (2013.01); *H03F 1/56* (2013.01); *H03F 2200/387* (2013.01)

(58) Field of Classification Search
CPC . H03F 3/19; H03F 1/0211; H03F 1/56; H03F 2200/387

USPC ........................................................ 330/297
See application file for complete search history.

(56) References Cited

U.S. PATENT DOCUMENTS

| 2005/0083117 | A1* | 4/2005 | Kim .......................... H03F 1/32 330/51 |
| 2016/0056774 | A1* | 2/2016 | Ilkov ......................... H03F 3/19 330/251 |
| 2017/0294951 | A1* | 10/2017 | Weissman ............ H04B 1/0064 |
| 2020/0220503 | A1* | 7/2020 | Seshita ................... H03F 1/223 |

FOREIGN PATENT DOCUMENTS

WO 2019/172283 A1 9/2019

* cited by examiner

*Primary Examiner* — Hafizur Rahman
(74) *Attorney, Agent, or Firm* — Pearne & Gordon LLP

(57) ABSTRACT

A high-frequency circuit includes an amplifier, a power distributor disposed on an output route of the amplifier, a first by-pass route that bypasses the amplifier, a second by-pass route that bypasses the power distributor, a first switch and a second switch disposed in series on the first by-pass route, and a third switch disposed in series on the second by-pass route. The first by-pass route is connected to a first node on a route connecting a signal input terminal and the amplifier and a second node on a route connecting the amplifier and the power distributor. The second by-pass route is connected to a third node between the first switch and the second switch and a fourth node on an output route of the power distributor.

15 Claims, 9 Drawing Sheets

HIGH-FREQUENCY CIRCUIT

This application claims priority from Japanese Patent Application No. 2019-237083 filed on Dec. 26, 2019. The content of this application is incorporated herein by reference in its entirety.

BACKGROUND OF THE DISCLOSURE

1. Field of the Disclosure

The present disclosure relates to a high-frequency circuit.

2. Description of the Related Art

International Publication No. 2019/172283 discloses a high-frequency circuit including an amplifier, a power distributor connected to the output side of the amplifier, and a by-pass circuit for causing a high-frequency signal to bypass the amplifier and to be outputted to the power distributor. The by-pass circuit includes a switch that is brought into conduction when the by-pass circuit transmits a high-frequency signal and an attenuator functioning as a circuit for impedance matching between the by-pass circuit and the power distributor.

In the case where a by-pass route (hereinafter referred to as a distributor by-pass route) that bypasses the amplifier and the power distributor is further provided in addition to a by-pass route (hereinafter referred to as an amplifier by-pass route) that bypasses the amplifier in the high-frequency circuit disclosed in International Publication No. 2019/172283, the configuration is assumed in which a switch is provided on the distributor by-pass route. This configuration enables the switching among (1) the state where a high-frequency signal is amplified by the amplifier, (2) the state where the signal that has bypassed the amplifier is outputted to the power distributor, and (3) the state where the signal that has bypassed the amplifier and the power distributor is outputted.

However, if the distributor by-pass route is provided to connect the input-side node of the amplifier and the output-side node of the power distributor, the switch on the amplifier by-pass route and the switch on the distributor by-pass route are connected in parallel with the input-side node of the amplifier. In this case, since the number of switches connected to the input-side node of the amplifier increases, the influence of a switch off-capacitance becomes large in high-frequency signal transmission characteristics. For example, in the case where a high-frequency signal is transmitted via the amplifier in the state where the switch on the amplifier by-pass route and the switch on the distributor by-pass route are in the non-conductive state, the amount of leakage of the high-frequency signal into the amplifier by-pass route and the distributor by-pass route increases. This leads to the degradation in the noise figure of the amplifier.

BRIEF SUMMARY OF THE DISCLOSURE

The present disclosure has been made to solve the above problem, and it is an object of the present disclosure to provide a high-frequency circuit including an amplifier whose noise figure is less prone to degradation, a distributor, and a by-pass route.

A high-frequency circuit according to an embodiment of the present disclosure includes a signal input terminal, an amplifier that amplifies a high-frequency signal inputted from the signal input terminal, a power distributor that is disposed on an output route of the amplifier and performs power distribution upon a high-frequency signal, a first by-pass route that bypasses the amplifier and transmits a high-frequency signal, a second by-pass route that bypasses the power distributor and transmits a high-frequency signal, a first switch and a second switch that are disposed in series on the first by-pass route and switch between transmission and non-transmission of a high-frequency signal through the first by-pass route, and a third switch that is disposed in series on the second by-pass route and switches between transmission and non-transmission of a high-frequency signal through the second by-pass route. The first by-pass route is connected to a first node on a route connecting the signal input terminal and an input terminal of the amplifier and a second node on a route connecting an output terminal of the amplifier and an input terminal of the power distributor. The second by-pass route is connected to a third node between the first switch and the second switch on the first by-pass route and a fourth node on an output route of the power distributor.

According to an embodiment of the present disclosure, there can be provided a high-frequency circuit including an amplifier whose noise figure is less prone to degradation, a distributor, and a by-pass route.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
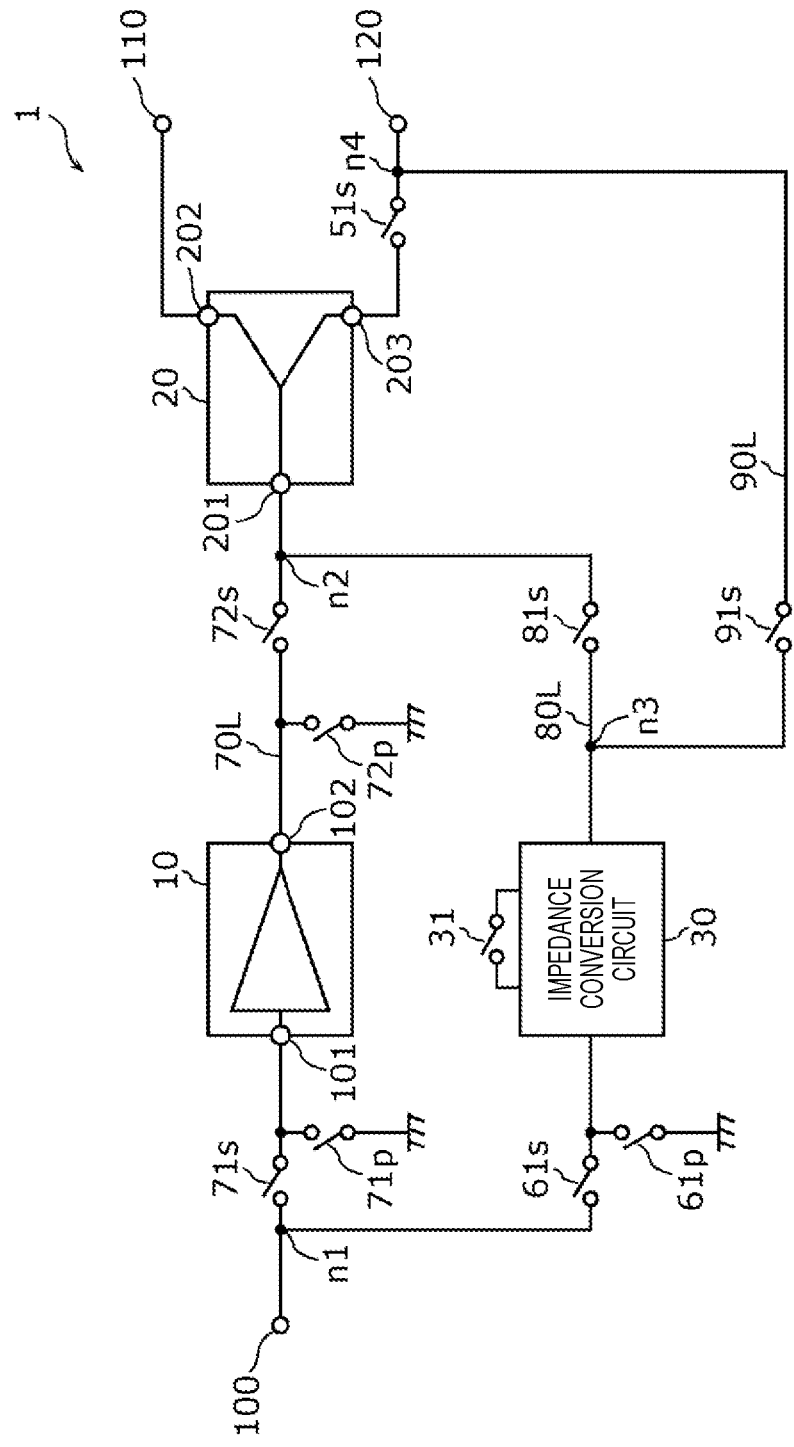
FIG. 1 is a diagram illustrating the circuit configuration of a high-frequency circuit according to an embodiment.

Embodiments of the present disclosure will be described in detail below. Each of the embodiments to be described below represents a comprehensive or concrete example. The numerical values, shapes, materials, components, arrangement and coupling forms of components, and the like to be described in the following embodiments, examples, and modifications are merely examples, and do not limit the present disclosure. Components not described in the independent claims among the components in the following examples and modifications are described as optional components. Also, the sizes or the ratio of sizes of the components illustrated in the drawings are not necessarily precise. Substantially the same components in the drawings are denoted by the same reference numerals, and overlapping explanation is sometimes omitted or simplified.

In the following description, terms representing a relationship between elements such as the terms "parallel" and "perpendicular", terms representing the shape of an element such as the term "rectangular", and the range of numerical values are used as not only expressions used in a strict sense but also expressions representing a substantially equivalent range, for example, inclusion of a several percentage difference.

In the following description, the term "route" (hereinafter also a "path") means a transmission line including a wiring line through which a high-frequency signal transmits, an electrode directly connected to the wiring line, a terminal directly connected to the wiring line or the electrode, and other components.

In the following description, the expression "A and B are connected" is applied to not only the case where A and B are physically connected but also the case where A and B are electrically connected.

EMBODIMENTS

[1. Circuit Configuration of High-Frequency Circuit 1]

FIG. 1 is a diagram illustrating the circuit configuration of the high-frequency circuit 1 according to an embodiment. The high-frequency circuit 1 includes an amplifier 10, a power distributor 20, a signal amplification route 70L, by-pass routes 80L and 90L, switches 51s, 61s, 61p, 71s, 71p, 72s, 72p, 81s, and 91s, an impedance conversion circuit 30, a signal input terminal 100, and signal output terminals 110 and 120. The high-frequency circuit 1 is a front-end circuit installed into a mobile communication device, such as a cellular phone. A reception signal received by an antenna disposed in a mobile communication device is inputted into the high-frequency circuit 1 via the signal input terminal 100.

The amplifier 10 amplifies a high-frequency signal inputted from the signal input terminal 100. The amplifier 10 is, for example, a low-noise amplifier for amplifying a reception signal inputted from the signal input terminal 100. The amplifier 10 may be a power amplifier. The amplifier 10 is configured as, for example, a silicon (Si) complementary metal oxide semiconductor (CMOS), a gallium arsenide (GaAs) field-effect transistor (FET), or a hetero bipolar transistor (HBT). The amplifier 10 may be configured as, for example, a silicon-germanium (SiGe) bipolar transistor.

In this embodiment, an input terminal 101 of the amplifier 10 is connected to the signal input terminal 100 via the switch 71s. An output terminal 102 of the amplifier 10 is connected to an input terminal 201 of the power distributor 20 via the switch 72s. That is, the amplifier 10 and the power distributor 20 are disposed on the signal amplification route 70L that connects the signal input terminal 100 to each of the signal output terminals 110 and 120.

The power distributor 20 is disposed on the output route of the amplifier 10 and performs power distribution upon a high-frequency signal. Specifically, the power distributor 20 performs power distribution upon a high-frequency signal inputted from the input terminal 201 and outputs the high-frequency signal that has been subjected to the power distribution from output terminals 202 and 203.

Figure 2A:
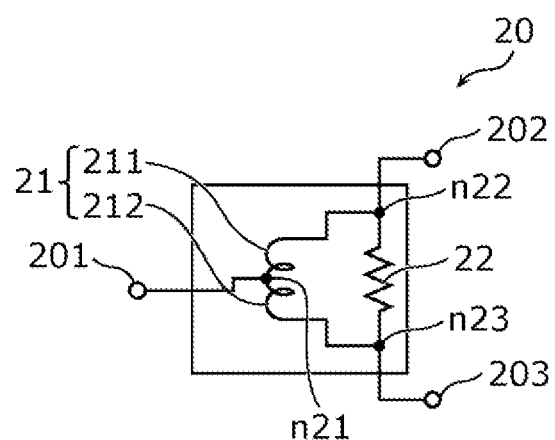
FIG. 2A is a diagram illustrating an exemplary circuit configuration of a power distributor according to an embodiment.

FIG. 2A is a diagram illustrating an exemplary circuit configuration of the power distributor 20 according to an embodiment. As illustrated in this drawing, the power distributor 20 includes, for example, a differential inductor 21 and a resistance element 22.

The differential inductor 21 includes a node n21 connected to the input terminal 201 and a coiled first line 211 and a coiled second line 212 which are connected to the node n21. For example, the first line 211 and the second line 212 have opposite winding directions and the same coil axis.

One end of the first line 211 is connected to the node n21, and the other end of the first line 211 is connected to a node n22 on the output side of the first line 211. The node n22 is a node located between the output terminal of the first line 211 and the output terminal 202. One end of the second line 212 is connected to the node n21, and the other end of the second line 212 is connected to a node n23 on the output side of the second line 212. The node n23 is a node located between the output terminal of the second line 212 and the output terminal 203.

The resistance element 22 connects the nodes n22 and n23. The resistance element 22 is provided to establish the isolation between a signal outputted from the output terminal 202 and a signal outputted from the output terminal 203. For example, when the impedance at the nodes n22 and n23 are 50Ω, the resistance value of the resistance element 22 is set to 100Ω that is twice the impedance.

With the above configuration of the power distributor 20 including the differential inductor 21 and the single resistance element 22, the size can be reduced as compared with a configuration in the related art in which power distribution is performed using a plurality of resistance elements. In the case of a configuration in the related art, the power loss of approximately 6 dB is generated. However, with the above configuration in which the differential inductor 21 is used, the power loss can be reduced to approximately 3 dB.

In the case where the impedance (an output impedance) when the power distributor 20 is viewed from the output terminals 202 and 203 is 50Ω, the impedance (an input impedance) when the power distributor 20 is viewed from the input terminal 201 becomes 25Ω with the above configuration. That is, the input impedance of the power distributor 20 becomes lower than the output impedance of the power distributor 20.

When the input impedance of the amplifier 10 is approximately 50Ω and the output impedance of the amplifier 10 is approximately 25Ω, there is no need to provide an impedance conversion circuit between the amplifier 10 and the power distributor 20 as illustrated in FIG. 1.

Figure 2B:
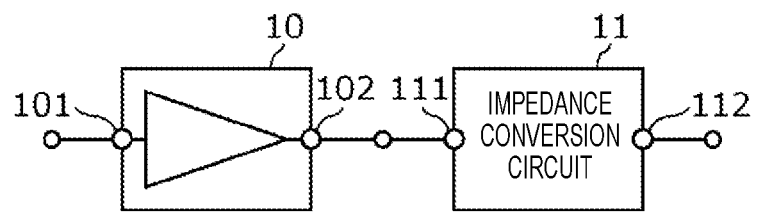
FIG. 2B is a diagram illustrating an exemplary circuit configuration of an amplifier according to an embodiment and a peripheral circuit.

In contrast, in the case where the output impedance of the amplifier 10 and the input impedance of the power distributor 20 differ from each other, an impedance conversion circuit 11 may be provided as illustrated in FIG. 2B.

FIG. 2B is a diagram illustrating an exemplary circuit configuration of the amplifier 10 according to an embodiment and a peripheral circuit. In the case where the output impedance of the amplifier 10 and the input impedance of the power distributor 20 differ from each other, the impedance conversion circuit 11 may be disposed between the amplifier 10 and the power distributor 20 as illustrated in the drawing. Specifically, the output terminal 102 of the amplifier 10 and an input terminal 111 of the impedance conversion circuit 11 are connected, and an output terminal 112 of the impedance conversion circuit 11 is connected to the input terminal 201 of the power distributor 20 via the switch 72s. Accordingly, the transmission loss of a high-frequency signal transmitted through the amplifier 10 and the power distributor 20 can be reduced.

Referring back to FIG. 1, the high-frequency circuit 1 will be described.

The by-pass route 80L is an example of a first by-pass route (the amplifier by-pass route). The by-pass route 80L bypasses the amplifier 10 and transmits a high-frequency signal. One end of the by-pass route 80L is connected to a node n1 (a first node) on the route connecting the signal input terminal 100 and the input terminal 101 of the amplifier 10, and the other end of the by-pass route 80L is connected to a node n2 (a second node) on the route connecting the output terminal 102 of the amplifier 10 and the input terminal 201 of the power distributor 20.

The switch 61s is an example of a first switch and is disposed in series on the by-pass route 80L. The switch 61s switches between the transmission and non-transmission of a high-frequency signal through the by-pass route 80L. In other words, the switch 61s selectively allows transmission of a high-frequency signal through the by-pass route 80L. The switch 81s is an example of a second switch and is disposed in series on the by-pass route 80L. The switch 81s switches between the transmission and non-transmission of a high-frequency signal through the by-pass route 80L. The switch 61s is disposed closer to the node n1 than the switch 81s. The switch 81s is disposed closer to the node n2 than the switch 61s.

The by-pass route 90L is an example of a second by-pass route (the power distributor by-pass route). The by-pass route 90L bypasses the power distributor 20 and transmits a high-frequency signal. One end of the by-pass route 90L is connected to a node n3 (a third node) between the switches 61s and 81s on the by-pass route 80L, and the other end of the by-pass route 90L is connected to a node n4 (a fourth node) on the output route of the power distributor 20.

The switch 91s is an example of a third switch and is disposed in series on the by-pass route 90L. The switch 91s switches between the transmission and non-transmission of a high-frequency signal through the by-pass route 90L.

With the above connection configurations of the by-pass routes 80L and 90L, a route (hereinafter sometimes referred to as a composite by-pass route (80L+90L)) connecting a part of the by-pass route 80L from the nodes n1 to n3 and the by-pass route 90L bypasses the amplifier 10 and the power distributor 20 and transmits a high-frequency signal.

With the above configuration of the high-frequency circuit 1, the switching can be performed among (1) the state where the amplifier 10 amplifies a high-frequency signal (the signal amplification route 70L), (2) the state where a signal that has bypassed the amplifier 10 is outputted to the power distributor 20 (the by-pass route 80L), and (3) the state where a signal that has bypassed the amplifier 10 and the power distributor 20 is outputted (the composite by-pass route (80L+90L)).

One end of the by-pass route 90L is not connected to the node n1 to which one end of the by-pass route 80L is connected but to a stage subsequent to the switch 61s disposed on the by-pass route 80L. That is, the switch 91s on the by-pass route 90L is not connected in parallel with the switch 61s on the by-pass route 80L at the node n1. Since the number of switches connected to the node n1 does not increase because of the by-pass route 90L, the increase in a switch off-capacitance can be suppressed at the time of transmission of a high-frequency signal through the signal amplification route 70L. That is, in the case where the switches 61s and 91s are brought into the non-conductive state and a high-frequency signal is transmitted through the signal amplification route 70L, the amount of leakage of the high-frequency signal into the by-pass route 90L via the off-capacitance can be reduced. Accordingly, in the high-frequency circuit 1 including the two by-pass routes 80L and 90L, the degradation in the noise figure of the amplifier 10 can be suppressed.

The impedance conversion circuit 30 is disposed between the switches 61s and 81s on the by-pass route 80L.

In this embodiment, the impedance conversion circuit 30 is disposed between the switch 61s and the node n3. Accordingly, a high-frequency signal that has passed through the impedance conversion circuit 30 can transmit through either the by-pass route 80L (from the node n3 to the node n2) or the by-pass route 90L. The impedance conversion circuit 30 therefore functions as a circuit for performing the matching between the impedance at the signal input terminal 100 and the input impedance of the power distributor 20, and the matching between the impedance at the signal input terminal 100 and the impedance at the signal output terminal 120.

For example, the case is assumed where the impedance (input impedance) when the high-frequency circuit 1 is viewed from the signal input terminal 100 is 50Ω, the input impedance of the power distributor 20 is 25Ω, the impedance (output impedance) when the high-frequency circuit 1 is viewed from the signal output terminal 120 is 50Ω. In the case where the matching between the input impedance (50Ω) at the signal input terminal 100 and the output impedance (50Ω) at the signal output terminal 120 is performed, that is, a high-frequency signal inputted from the signal input terminal 100 is transmitted through the by-pass route 90L, the impedance conversion circuit 30 does not perform impedance conversion (a first impedance state). On the other hand, in the case where the matching between the input impedance (50Ω) at the signal input terminal 100 and the input impedance (25Ω) of the power distributor 20 is performed, that is, a high-frequency signal inputted from the signal input terminal 100 is transmitted through the by-pass route 80L and the power distributor 20, the impedance conversion circuit 30 performs impedance conversion (a second impedance state).

The impedance conversion circuit 30 may include a switch 31 for switching between the impedance states. The switch 31 is an example of a fourth switch and switches between the first impedance state and the second impedance state.

Even in the case where a high-frequency signal is transmitted through the by-pass route 80L (from the node n3 to the node n2) and the by-pass route 90L, the impedance conversion circuit 30 can reduce the transmission loss of the high-frequency signal. By causing the impedance conversion circuit to perform a conversion operation (the second impedance state) and a stop operation (the first impedance state), both the matching when a high-frequency signal is transmitted through the power distributor 20 and the matching when a high-frequency signal bypasses the power distributor 20 can be performed well, and the transmission loss of a high-frequency signal can be reduced. Since the single impedance conversion circuit 30 performs both the matching on the by-pass route 80L (from the node n3 to the node n2) and the matching on the by-pass route 90L, the increase in the circuit size of the high-frequency circuit 1 can be suppressed, and a mobile communication device including the high-frequency circuit 1 can be miniaturized.

The impedance conversion circuit does not necessarily have to include the switch 31. The impedance conversion circuit 30 may be disposed, for example, between the nodes n3 and the switch 81s. In this case, a high-frequency signal that has passed through the impedance conversion circuit 30 does not transmit through both the by-pass routes 80L and 90L but through only the by-pass route 80L. Accordingly, the impedance conversion circuit 30 may perform only the matching between the impedance at the signal input terminal 100 and the input impedance of the power distributor 20. In this case, since the number of impedances states of the impedance conversion circuit 30 is one, the impedance conversion circuit 30 does not need to change an impedance state.

The switch 72s is an example of a fifth switch and is disposed in series on the route connecting the output terminal 102 of the amplifier 10 and the node n2. With the switch 72s, the degree of the isolation between the signal amplification route 70L and the by-pass route 80L can be increased. For example, in the case where the by-pass route 80L (from the node n3 to the node n2) is selected, the flow of a high-frequency signal that has transmitted through the by-pass route 80L into the amplifier 10 from the node n2 can be prevented by bringing the switch 72s into the non-conductive state.

The switch 71s is an example of a sixth switch and is disposed in series on the route connecting the node n1 and the input terminal 101 of the amplifier 10. Although the amplifier 10 can stop the amplification function by stopping the application of a bias voltage or a power supply voltage, for example, it is difficult to obtain an infinite input impedance. Accordingly, in the case where the by-pass route 80L (from the node n3 to the node n2) or the by-pass route 90L is selected, the isolation between the by-pass route 80L or 90L and the signal amplification route 70L can be ensured with certainty by bringing the switch 71s into the non-conductive state.

The switch 51s is an example of a seventh switch and is disposed in series on the route connecting the output terminal 203, which is one of the output terminals of the power distributor 20, and the node n4. With the switch 51s, the signal output terminal 120 can be used as both the output terminal from which the high-frequency signal that has transmitted through the power distributor 20 is outputted and the output terminal from which the high-frequency signal that has transmitted through the by-pass route 90L is outputted. Accordingly, the number of input/output terminals of the high-frequency circuit 1 can be reduced. The degree of the isolation between the by-pass route 90L and each of the signal amplification route 70L and the by-pass route 80L can be increased. For example, in the case where the by-pass route 90L is selected, the flow of the high-frequency signal that has transmitted through the by-pass route 90L into the power distributor 20 from the node n4 can be prevented by bringing the switch 51s into the non-conductive state.

The switch 51s may be disposed in series with the output terminal 202 that is one of the output terminals of the power distributor 20. In this case, the node n4 to which the other end of the by-pass route 90L is connected is disposed on the route connecting the output terminal 202 and the signal output terminal 110.

The switch 71p is a switch for enhancing the isolation function of the switch 71s and is connected between the node on the route connecting the switch 71s and the input terminal 101 of the amplifier 10 and the ground.

The switch 72p is a switch for enhancing the isolation function of the switch 72s and is connected between the node on the route connecting the switch 72s and the output terminal 102 of the amplifier 10 and the ground.

The switch 61p is a switch for enhancing the isolation function of the switch 61s and is connected between the node on the route connecting the switch 61s and the impedance conversion circuit 30 and the ground.

In the high-frequency circuit 1 according to this embodiment, the signal input terminal 100, the amplifier 10, the power distributor 20, the by-pass routes 80L and 90L, and the switches 61s, 81s, and 91s are essential components and the other components are not essential.

[2. Signal Transmission State of the High-Frequency Circuit 1]

The relationship between the transmission of a signal through the signal amplification route 70L and the by-pass routes 80L and 90L and the state of each switch will be described.

Figure 3A:
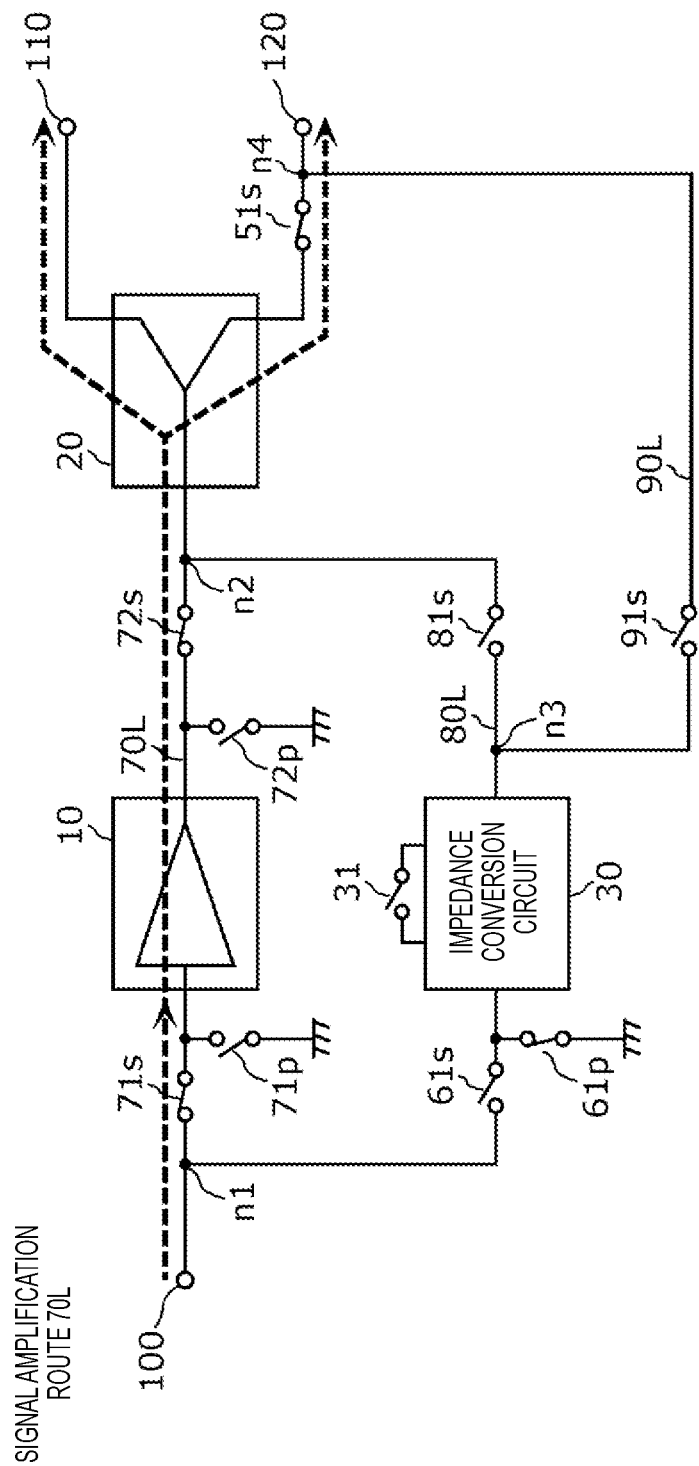
FIG. 3A is a diagram illustrating a circuit state when a high-frequency signal is transmitted through a signal amplification route in a high-frequency circuit according to an embodiment.

FIG. 3A is a diagram illustrating a circuit state when a high-frequency signal is transmitted through the signal amplification route 70L in the high-frequency circuit 1 according to an embodiment. The switches 51s 71s, 72s, and 61p are brought into the conductive state, and the switches 61s, 81s, 91s, 71p, and 72p are brought into the non-conductive state. A high-frequency signal inputted from the signal input terminal 100 is transmitted through the node n1, the switch 71s, the amplifier 10, the switch 72s, the node n2, and the power distributor 20 and is outputted from the signal output terminals 110 and 120.

Figure 3B:
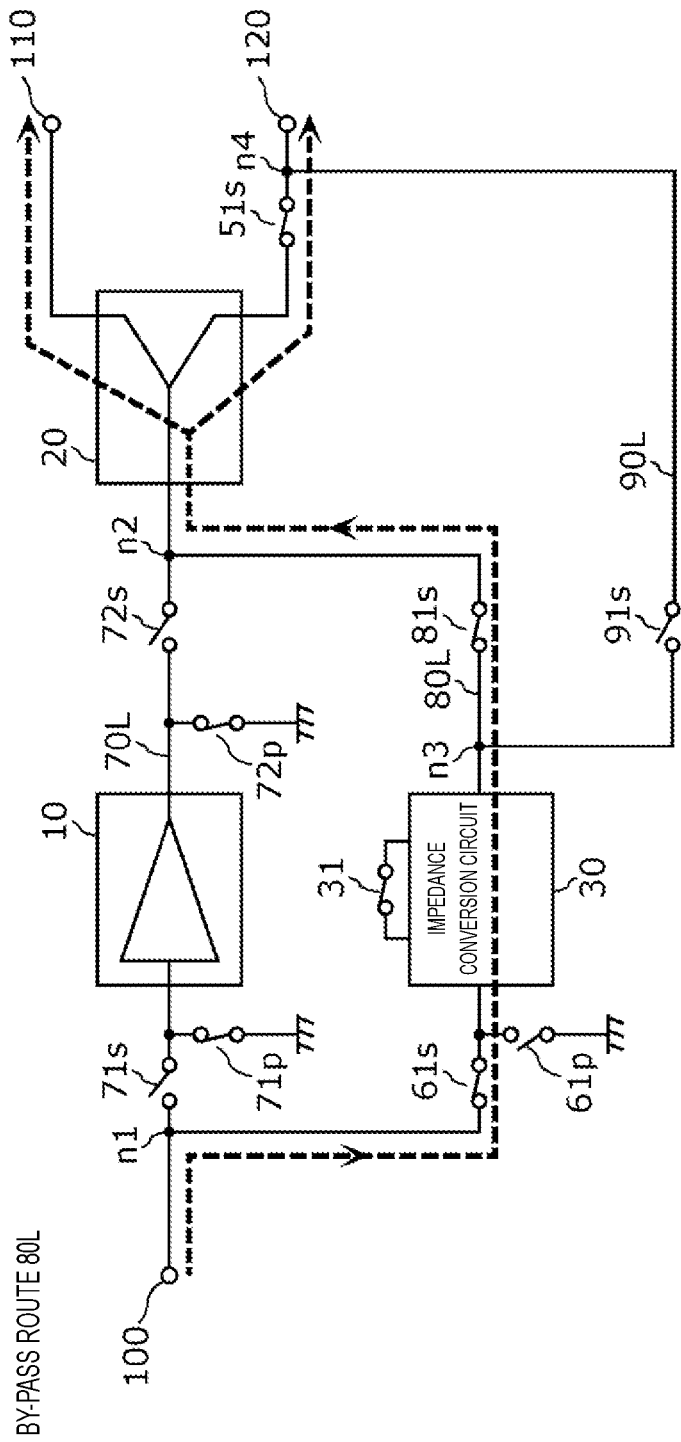
FIG. 3B is a diagram illustrating a circuit state when a high-frequency signal is transmitted through an amplifier by-pass route in a high-frequency circuit according to an embodiment.

FIG. 3B is a diagram illustrating a circuit state when a high-frequency signal is transmitted through the by-pass route 80L in the high-frequency circuit 1 according to an embodiment. The switches 51s, 61s, 81s, 71p, and 72p are brought into the conductive state, and the switches 71s, 72s, 91s, and 61p are brought into the non-conductive state. A high-frequency signal inputted from the signal input terminal 100 is transmitted through the node n1, the switch 61s, the impedance conversion circuit 30, the node n3, the switch 81s, the node n2, and the power distributor 20 and is outputted from the signal output terminals 110 and 120.

Figure 3C:
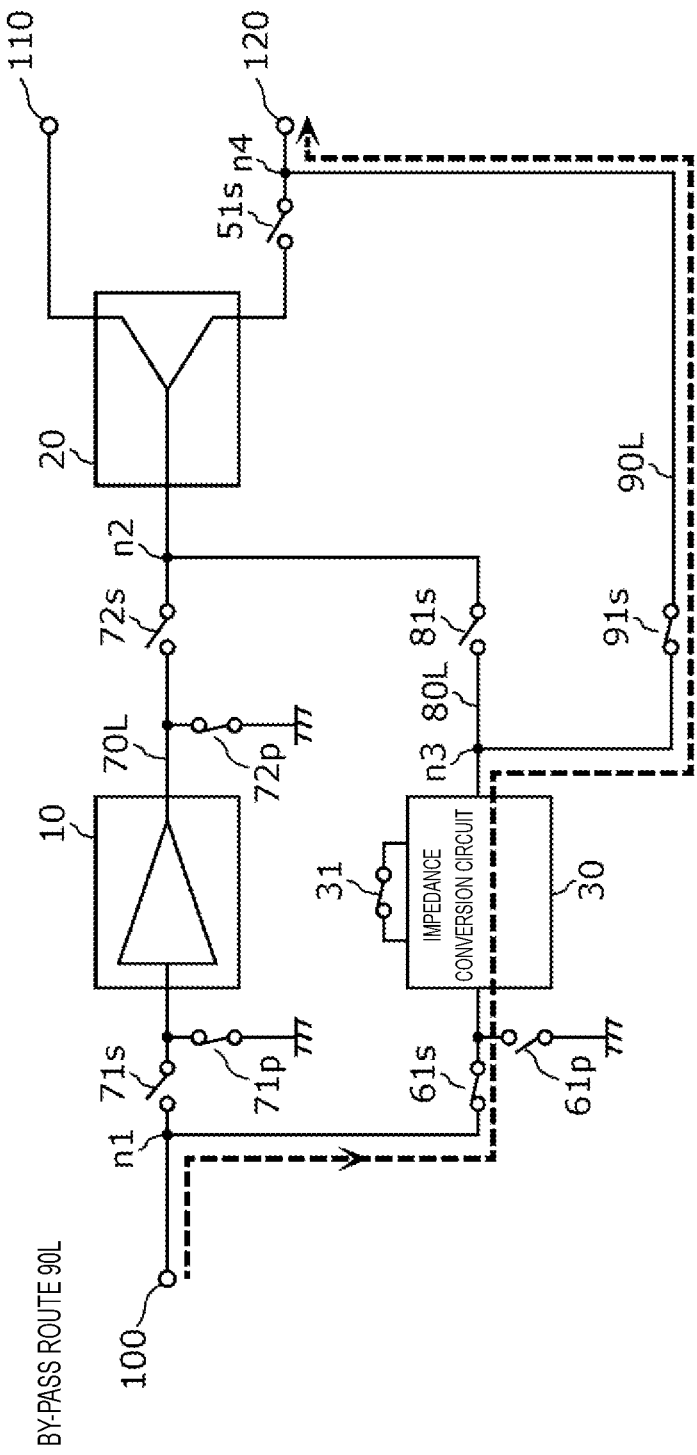
FIG. 3C is a diagram illustrating a circuit state when a high-frequency signal is transmitted through a power distributor by-pass route in a high-frequency circuit according to an embodiment.

FIG. 3C is a diagram illustrating a circuit state when a high-frequency signal is transmitted through the composite by-pass route (80L+90L) in the high-frequency circuit 1 according to an embodiment. The switches 61s, 91s, 71p, and 72p are bought into the conductive state, and the switches 51s, 71s, 72s, 81s, and 61p are brought into the non-conductive state. A high-frequency signal inputted from the signal input terminal 100 is transmitted through the node n1, the switch 61s, the impedance conversion circuit 30, the node n3, the switch 91s, and the node n4 and is outputted from the signal output terminal 120.

[3. Comparison with High-Frequency Circuit 500 According to Comparative Example]

The high-frequency circuit 1 according to this embodiment and the high-frequency circuit 500 according to a comparative example will be compared with each other.

Figure 4:
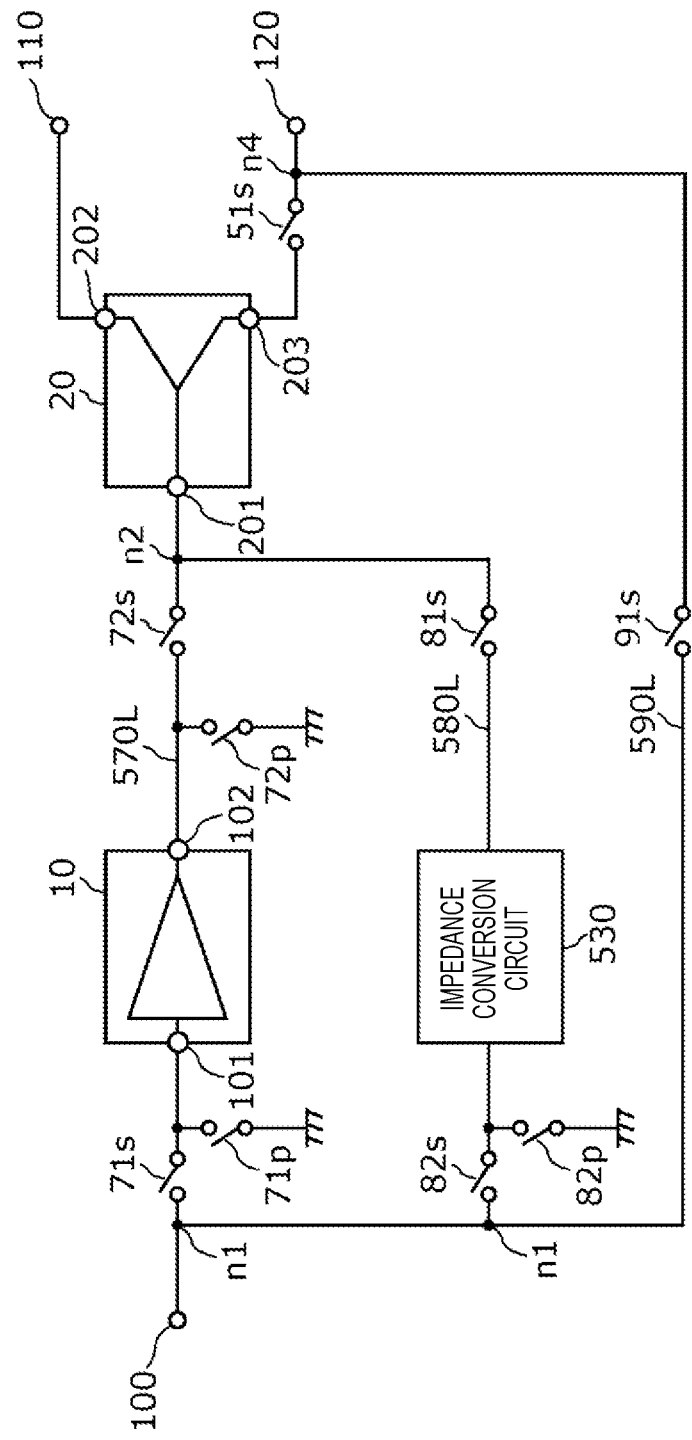
FIG. 4 is a diagram illustrating the circuit configuration of a high-frequency circuit according to a comparative example.

FIG. 4 is a diagram illustrating the circuit configuration of the high-frequency circuit 500 according to a comparative example. The high-frequency circuit 500 includes the amplifier 10, the power distributor 20, a signal amplification route 570L, by-pass routes 580L and 590L, the switches 51s, 71s, 71p, 72s, 72p, 81s, and 91s, switches 82s and 82p, an impedance conversion circuit 530, the signal input terminal 100, and the signal output terminals 110 and 120. The high-frequency circuit 500 according to a comparative example differs from the high-frequency circuit 1 according to an embodiment in the connection configurations of the by-pass routes 580L and 590L. The descriptions of the same points in the high-frequency circuit 500 according to a comparative example as the high-frequency circuit 1 according to an embodiment will be omitted, and different points will be mainly described.

In this comparative example, the amplifier 10 and the power distributor 20 are disposed on the signal amplification route 570L connecting the signal input terminal 100 to each of the signal output terminals 110 and 120.

The by-pass route 580L bypasses the amplifier 10 and transmits a high-frequency signal. One end of the by-pass route 580L is connected to the node n1 on the route connecting the signal input terminal 100 and the input terminal 101 of the amplifier 10. The other end of the by-pass route 580L is connected to the node n2 on the route connecting the output terminal 102 of the amplifier 10 and the input terminal 201 of the power distributor 20.

The switch 82s is disposed in series on the by-pass route 580L and switches between the transmission and non-transmission of a high-frequency signal through the by-pass route 580L. The switch 81s is disposed in series on the by-pass route 580L and switches between the transmission and non-transmission of a high-frequency signal through the by-pass route 580L. The switch 82s is disposed closer to the node n1 than the switch 81s. The switch 81s is disposed closer to the node n2 than the switch 82s.

The by-pass route 590L bypasses the amplifier 10 and the power distributor 20 and transmits a high-frequency signal. One end of the by-pass route 590L is connected to the node n1, and the other end of the by-pass route 590L is connected to the node n4 on the output route of the power distributor 20.

The switch 91s is disposed in series on the by-pass route 590L and switches between the transmission and non-transmission of a high-frequency signal through the by-pass route 590L.

With the above configuration of the high-frequency circuit 500 according to a comparative example, the switching can be performed among (1) the state where the amplifier 10 amplifies a high-frequency signal (the signal amplification route 570L), (2) the state where the signal that has bypassed the amplifier 10 is outputted to the power distributor 20 (the by-pass route 580L), and (3) the state where the signal that has bypassed the amplifier 10 and the power distributor 20 is outputted (the by-pass route 590L).

However, since the by-pass route 590L is provided to connect the nodes n1 and n4, the switch 82s disposed on the by-pass route 580L and the switch 91s disposed on the by-pass route 590L are connected in parallel with the node n1. Since the number of switches connected in parallel with the node n1 is two in this case, the influence of a switch off-capacitance becomes large in high-frequency signal transmission characteristics. Accordingly, in the case where the switches 82s and 91s are brought into the non-conductive state and a high-frequency signal is transmitted through the signal amplification route 570L, the amount of leakage of the high-frequency signal into the by-pass routes 580L and 590L increases. The problem therefore occurs that the noise figure of the amplifier 10 degrades.

In contrast, in the high-frequency circuit 1 according to this embodiment, neither the switch 61s disposed on the by-pass route 80L nor the switch 91s disposed on the by-pass route 90L is connected in parallel with the node n1. In the case where the switch 91s disposed on the by-pass route 90L is in the non-conductive state and the by-pass route 90L is not used, the leakage of a high-frequency signal inputted from the signal input terminal 100 into the switch 91s is therefore suppressed. That is, regardless of whether the switch 91s is in the conductive or non-conductive state, there is almost no difference in signal power flowing from the signal input terminal 100 into the by-pass routes 80L and 90L. As a result, the noise figure of the amplifier 10 can be constant regardless of the presence of the by-pass route 90L. That is, the noise figure of the amplifier 10 does not degrade because of the addition of the by-pass route 90L.

In the high-frequency circuit 500 according to a comparative example, the impedance conversion circuit 530 is disposed between the switches 82s and 81s on the by-pass route 580L.

Figure 5:
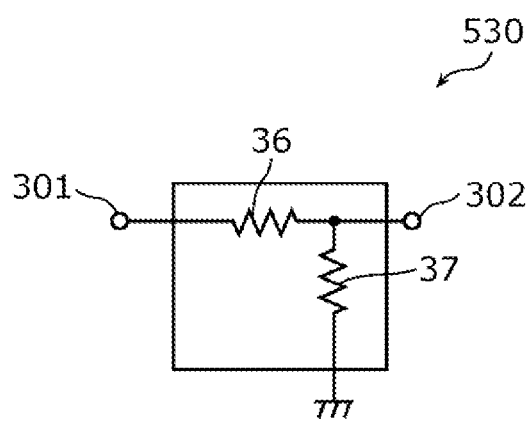
FIG. 5 is a diagram illustrating an exemplary circuit configuration of an impedance conversion circuit according to a comparative example.

FIG. 5 is a diagram illustrating an exemplary circuit configuration of the impedance conversion circuit 530 according to a comparative example. The impedance conversion circuit 530 includes a resistance element 36 disposed in series on the route connecting an input terminal 301 and an output terminal 302, and a resistance element 37 connected between a node on the route and the ground. By appropriately setting the resistance values of the resistance elements 36 and 37, for example, the input impedance of the impedance conversion circuit 530 can be approximately 50Ω, and the output impedance of the impedance conversion circuit 530 can be approximately 25Ω.

However, a high-frequency signal that passes through the impedance conversion circuit 530 transmits through only the by-pass route 580L. Accordingly, the impedance conversion circuit 530 performs only the matching between the impedance at the signal input terminal 100 and the input impedance of the power distributor 20 and cannot perform the matching between the impedance at the signal input terminal 100 and the output impedance of the power distributor 20 (the impedance matching on the by-pass route 590L).

[4. Circuit Configuration of High-Frequency Circuit 1A that is Example]

Figure 6:
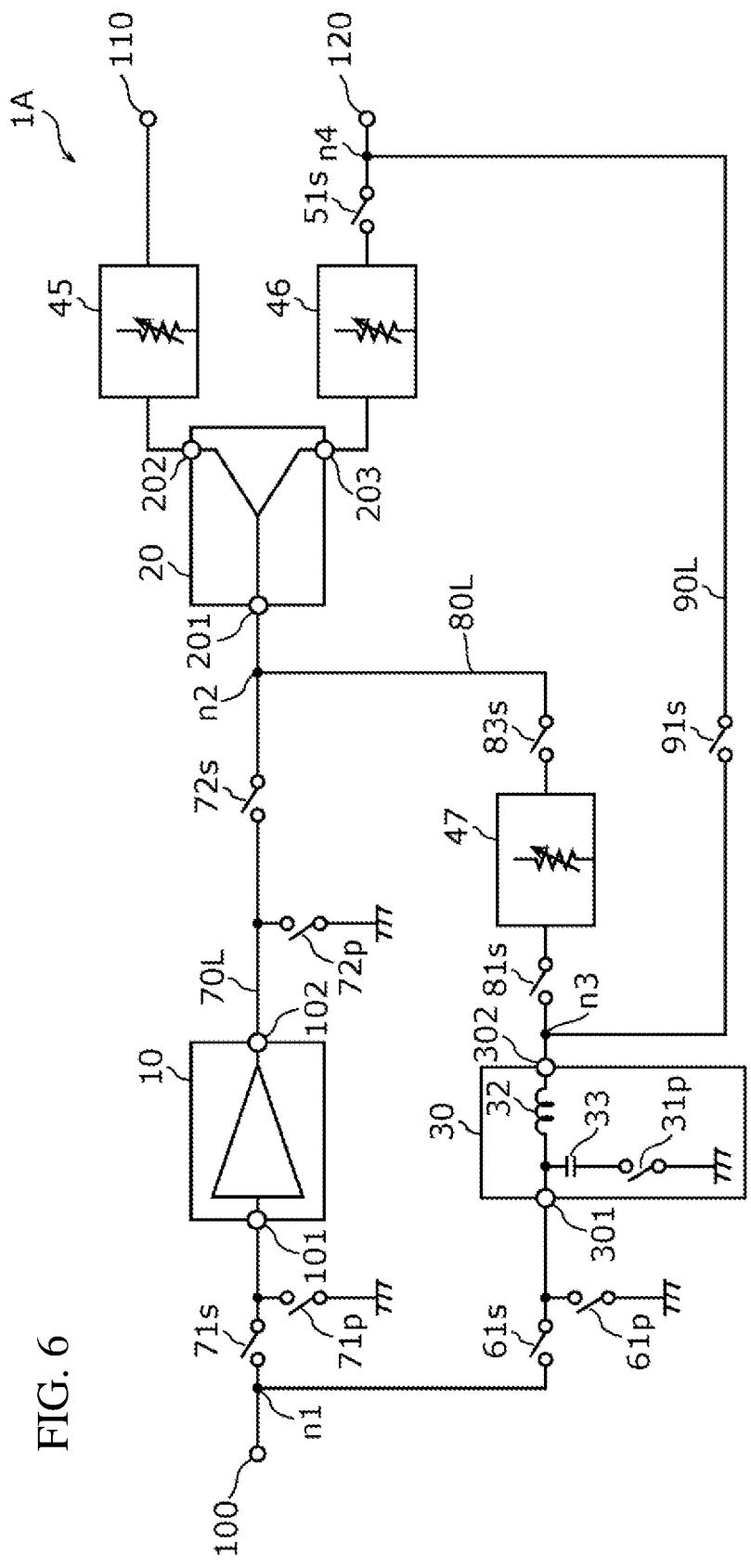
FIG. 6 is a diagram illustrating the circuit configuration of an example of a high-frequency circuit.

FIG. 6 is a diagram illustrating the circuit configuration of the high-frequency circuit 1A that is an example. The high-frequency circuit 1A in this example differs from the high-frequency circuit 1 in that the detailed circuit configuration of the impedance conversion circuit 30 is illustrated and variable attenuators are added. The high-frequency circuit 1A includes the amplifier 10, the power distributor 20, the signal amplification route 70L, the by-pass routes 80L and 90L, the switches 51s, 61s, 61p, 71s, 71p, 72s, 72p, 81s, and 91s, a switch 83s, the impedance conversion circuit 30, variable attenuators 45, 46, and 47, the signal input terminal 100, and the signal output terminals 110 and 120. The high-frequency circuit 1A in this example differs from the high-frequency circuit 1 according to an embodiment in that the detailed circuit configuration of the impedance conversion circuit 30 is illustrated and the switch 83s and the variable attenuators 45 to 47 are added. The descriptions of the same points in the high-frequency circuit 1A in this example as the high-frequency circuit 1 according to an embodiment will be omitted, and different points will be mainly described.

The switch 83s is disposed in series on the by-pass route 80L and switches between the transmission and non-transmission of a high-frequency signal through the by-pass route 80L. The switch 83s is disposed closer to the node n2 than the switch 81s.

The variable attenuator 45 is an example of a first variable attenuator and is disposed on the route connecting the output terminal 202 of the power distributor 20 and the signal output terminal 110. The variable attenuator 46 is an example of the first variable attenuator and is disposed on the route connecting the output terminal 203 of the power distributor 20 and the signal output terminal 120.

The variable attenuators 45 and 46 can adjust the power (signal level) of a high-frequency signal outputted from the power distributor 20.

The variable attenuator 47 is an example of a second variable attenuator and is deposed between the impedance conversion circuit 30 and the node n2 on the by-pass route 80L. More specifically, the variable attenuator 47 is disposed between the switches 81s and 83s.

The variable attenuator 47 can adjust the power (signal level) of a high-frequency signal that transmits through the by-pass route 80L. In the case where the output impedance of the impedance conversion circuit 30 and the input impedance of the power distributor 20 are set to approximately 25Ω, the impedance of the variable attenuator 47 is also set to approximately 25Ω.

The impedance conversion circuit 30 includes an inductor 32, a capacitor 33, and a switch 31p (the fourth switch). The inductor 32 is disposed in series on the route connecting the input terminal 301 and the output terminal 302. The series connection circuit of the capacitor 33 and the switch 31p is disposed in series between a node on the route and the ground. The capacitor 33 may be connected to the ground, and the switch 31p may be connected to the above node. The inductor 32 is an example of a series arm circuit disposed on the by-pass route 80L. The series connection circuit of the capacitor 33 and the switch 31p is an example of a parallel arm circuit disposed on the route connecting a node on the by-pass route 80L and the ground. Although the above series connection circuit is connected to the node that is closer to the input side than the inductor 32 on the route connecting the input terminal 301 and the output terminal 302 in this example, it may be connected to a node that is closer to the output side than the inductor 32 on the route connecting the input terminal 301 and the output terminal 302. The series connection circuit of a capacitor and a switch may be used as a series arm circuit, and an inductor may be used as a parallel arm circuit.

In the case where the switch 31p is in the conductive state in the impedance conversion circuit 30 having the above configuration, for example, the input-side impedance (50Ω) of the impedance conversion circuit 30 is converted into the output-side impedance (25Ω) of the impedance conversion circuit 30 (the second impedance state). In the case where the switch 31p is in the non-conductive state, for example, the output-side impedance (50Ω) of the impedance conversion circuit 30 can be set without the conversion of the input-side impedance (50Ω) of the impedance conversion circuit 30 (the first impedance state).

The impedance conversion circuit 30 does not include a resistance element. That is, by using only a reactive element as a circuit element in the impedance conversion circuit 30, a transmission loss can be reduced. Accordingly, in the case where a high-frequency signal is transmitted through the by-pass route 80L, the transmission loss of the high-frequency circuit 1A can be reduced.

In the case where a high-frequency signal is transmitted through the composite by-pass route (80L+90L), the switch 31p is brought into the non-conductive state, and the impedance conversion operation is stopped (the first impedance state is set). In this case, the inductor 32 that is present on the signal route can perform the matching (cancellation) of an unnecessary capacitance component generated between each of the switches and the ground. As a result, the matching at the time of the use of the by-pass route 90L can be performed well, and the transmission loss can be reduced. Since the inductor 32 and the capacitor 33 have a low-pass filter function, unnecessary distortion components in a high-frequency band can be reduced.

The impedance conversion circuit 30 may be an impedance conversion circuit 30A according to a first modification to be described below or an impedance conversion circuit 30B according to a second modification to be described below.

Figure 7A:
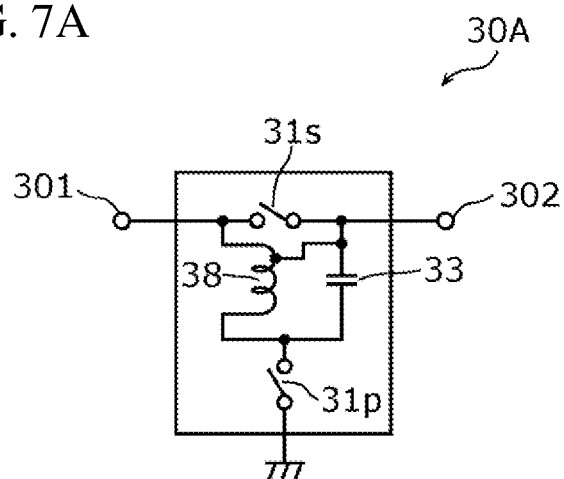
FIG. 7A is a diagram illustrating the circuit configuration of an impedance conversion circuit according to a first modification.

FIG. 7A is a diagram illustrating the circuit configuration of the impedance conversion circuit 30A according to the first modification. The impedance conversion circuit 30A includes a transformer element 38, the capacitor 33, a switch 31s (the fourth switch), and the switch 31p (the fourth switch). The parallel connection circuit of the transformer element 38 and the switch 31s is disposed on the route connecting the input terminal 301 and the output terminal 302. The switch 31p for operating the transformer element 38 is disposed between the low-potential-side terminal of the transformer element 38 and the ground. The capacitor 33 used for matching is connected between the output terminal and the low-potential-side terminal of the transformer element 38. By switching between the conduction and non-conduction of the switches 31s and 31p, the switching between the impedance conversion operation (the second impedance state) and the impedance conversion stop operation (the first impedance state) of the impedance conversion circuit 30A can be performed.

With the above configuration of the impedance conversion circuit 30A in which only a reactive element is used as a circuit element, the transmission loss can be reduced. In the case where a high-frequency signal is transmitted through the by-pass route 80L, the transmission loss of the high-frequency circuit 1A can be reduced. In addition, by optimizing the impedance matching of the transformer element 38, the impedance conversion circuit 30A can operate in a wide frequency band.

Figure 7B:
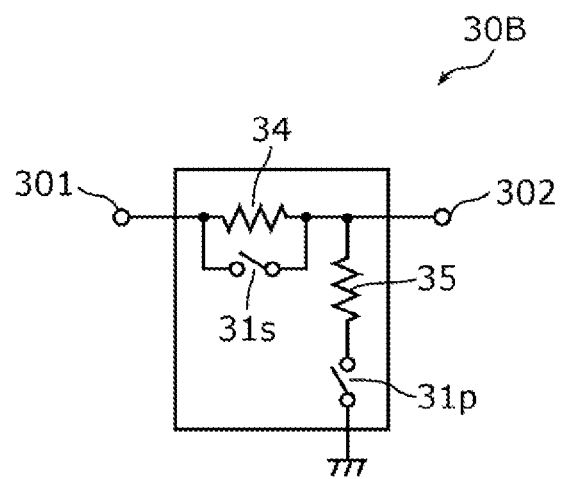
FIG. 7B is a diagram illustrating the circuit configuration of an impedance conversion circuit according to a second modification.

FIG. 7B is a diagram illustrating the circuit configuration of the impedance conversion circuit 30B according to the second modification. The impedance conversion circuit 30B includes resistance elements 34 and 35, the switch 31s (the fourth switch), and the switch 31p (the fourth switch). The parallel connection circuit of the resistance element 34 and the switch 31s is disposed on the route connecting the input terminal 301 and the output terminal 302. The series connection circuit of the resistance element 35 and the switch 31p is disposed in series between a node on the above route and the ground. By switching between the conduction and non-conduction of the switches 31s and 31p, the switching between the impedance conversion operation (the second impedance state) and the impedance conversion stop operation (the first impedance state) of the impedance conversion circuit 30B can be performed.

With the above configuration of the impedance conversion circuit 30B in which resistance elements are used and a reactive element is not used, the impedance conversion circuit 30B can operate in a wide frequency band. An inductor for which a relatively large footprint is needed is not used. Accordingly, by forming the impedance conversion circuit 30B as an IC, it can be miniaturized.

The impedance conversion circuit 30B may include at least one of the parallel connection circuit of the resistance element 34 and the switch 31s disposed on the route connecting the input terminal 301 and the output terminal 302, and the series connection circuit of the resistance element 35 and the switch 31p disposed in series between a node on the above route and the ground. The disposition of the above parallel connection circuit and the above series connection circuit is optimized in accordance with impedance values before and after conversion.

[5. Effects]

The high-frequency circuit 1 according to an embodiment includes the signal input terminal 100, the amplifier 10 that amplifies a high-frequency signal inputted from the signal input terminal 100, the power distributor 20 that is disposed on an output route of the amplifier 10 and performs power distribution upon a high-frequency signal, the by-pass route 80L that bypasses the amplifier 10 and transmits a high-frequency signal, the by-pass route 90L that bypasses the power distributor 20 and transmits a high-frequency signal, the switches 61s and 81s that are disposed in series on the by-pass route 80L and switch between transmission and non-transmission of a high-frequency signal through the by-pass route 80L, and the switch 91s that is disposed in series on the by-pass route 90L and switches between transmission and non-transmission of a high-frequency signal through the by-pass route 90L. The by-pass route 80L is connected to the node n1 on a route connecting the signal input terminal 100 and the input terminal 101 of the amplifier 10 and the node n2 on a route connecting the output terminal 102 of the amplifier 10 and the input terminal 201 of the power distributor 20. The by-pass route 90L is connected to the node n3 between the switches 61s and 81s on the by-pass route 80L and the node n4 on an output route of the power distributor 20.

With this configuration, the switching can be performed among (1) the state where the amplifier 10 amplifies a high-frequency signal, (2) the state where a signal that has bypassed the amplifier 10 is outputted to the power distributor 20, and (3) the state where a signal that has bypassed the amplifier 10 and the power distributor 20 is outputted. One end of the by-pass route 90L is not connected to the node n1 to which one end of the by-pass route 80L is connected but to a stage subsequent to the switch 61s disposed on the by-pass route 80L. That is, the switch 91s on the by-pass route 90L and the switch 61s on the by-pass route 80L are not connected in parallel at the node n1. Since the number of switches connected to the node n1 does not increase because of the by-pass route 90L, the increase in a switch off-capacitance can be suppressed at the time of transmission of a high-frequency signal through the signal amplification route 70L. That is, in the case where the switches 61s and 91s are brought into the non-conductive state and a high-frequency signal is transmitted through the signal amplification route 70L, the amount of leakage of the high-frequency signal into the by-pass route 90L via the off-capacitance can be reduced. Accordingly, in the high-frequency circuit 1 including the two by-pass routes 80L and 90L, the degradation in the noise figure of the amplifier 10 can be suppressed.

The high-frequency circuit 1 may further include the impedance conversion circuit 30 disposed between the switches 61s and 81s on the by-pass route 80L.

With this configuration, in the case where a high-frequency signal is transmitted through the by-pass route 80L, the matching between the impedance at the signal input terminal 100 and the input impedance of the power distributor 20 can be performed. Accordingly, the transmission loss of a high-frequency signal when the high-frequency signal bypasses the amplifier 10 can be reduced.

The switch 61s may be connected to the node n1. The switch 81s may be connected to the node n2. The impedance conversion circuit 30 may be disposed on a route connecting the switch 61s and the node n3. The impedance conversion circuit 30 may include the switch 31 that switches between the first impedance state and the second impedance state.

With this configuration, both the matching when a high-frequency signal is transmitted through the power distributor 20 and the matching when a high-frequency signal bypasses the power distributor 20 can be performed well, and the transmission loss of a high-frequency signal can be reduced by switching between e first impedance state and the second impedance state of the impedance conversion circuit 30. Since the single impedance conversion circuit 30 performs both the matching on the by-pass route 80L and the matching on the by-pass route 90L, the increase in the circuit size of the high-frequency circuit 1 can be suppressed, and a mobile communication device including the high-frequency circuit 1 can be miniaturized.

The impedance conversion circuit 30 may include at least one of the inductor 32 and the capacitor 33 and does not necessarily have to include a resistance element.

With this configuration in which the impedance conversion circuit 30 includes only a reactive element, the transmission loss of the impedance conversion circuit 30 can be reduced. Accordingly, in the case where a high-frequency signal is transmitted through the by-pass route 80L, the transmission loss of the high-frequency circuit 1 can be reduced.

The impedance conversion circuit 30 may include a series arm circuit disposed on the by-pass route 80L and a parallel arm circuit disposed on a route connecting a node on the by-pass route 80L and the ground. One of the series arm circuit and the parallel arm circuit may include the inductor 32. The other one of the series arm circuit and the parallel arm circuit may include the capacitor 33 and the switch 31p.

In the case where the switch 31p is in the conductive state, for example, the input-side impedance (50Ω) of the impedance conversion circuit 30 can be converted into the output-side impedance (25Ω) of the impedance conversion circuit 30 (the second impedance state). In the case where the switch 31p is in the non-conductive state, for example, the output-side impedance (50Ω) of the impedance conversion circuit 30 can be set without the conversion of the input-side impedance (50Ω) of the impedance conversion circuit 30 (the first impedance state).

The impedance conversion circuit 30A may include the transformer element 38.

With this configuration, by optimizing the impedance matching of the transformer element 38, the impedance conversion circuit 30A can operate in a wide frequency band.

The impedance conversion circuit 30B may include the resistance element 34 or 35.

With this configuration of the impedance conversion circuit 30B in which a resistance element is used, the impedance conversion circuit 30B can operate in a wide frequency band.

The resistance element 34 may be disposed in series on the by-pass route 80L. The switch 31s may be connected in parallel with the resistance element 34.

The switch 31p may be connected in series with the resistance element 35. A series connection circuit of the resistance element 35 and the switch 31p may be disposed in series on a route connecting a node on the by-pass route 80L and the ground.

By switching between the conduction and non-conduction of the switch 31s or 31p, the switching between the first impedance state and the second impedance state of the impedance conversion circuit 30B can be performed.

The high-frequency circuit 1 may further include the switch 72s disposed in series on a route connecting the output terminal 102 of the amplifier 10 and the node n2.

With this configuration, the degree of the isolation between the signal amplification route 70L and the by-pass route 80L can be increased. For example, in the case where the by-pass route 80L is selected, the flow of the high-frequency signal that has transmitted through the by-pass route 80L into the amplifier 10 from the node n2 can be prevented by bringing the switch 72s into the non-conductive state.

The high-frequency circuit 1 may further include the switch 71s disposed in series on a route connecting the node n1 and the input terminal 101 of the amplifier 10.

With this configuration, in the case where the by-pass route 80L or the composite by-pass route (80L+90L) is selected, the isolation between the by-pass route 80L or the composite by-pass route (80L+90L) and the signal amplification route 70L can be ensured with certainty by bringing the switch 71s into the non-conductive state.

The power distributor 20 may have the output terminals 202 and 203. The high-frequency circuit 1 may further include the switch 51s disposed in series on a route connecting the output terminal 203 and the node n4.

With this configuration, the signal output terminal 120 can be used as both the output terminal from which the high-frequency signal that has transmitted through the power distributor 20 is outputted, and the output terminal from which the high-frequency signal that has transmitted through the by-pass route 90L is outputted. Accordingly, the number of the input/output terminals of the high-frequency circuit 1 can be reduced. The degree of the isolation between the by-pass route 90L and each of the signal amplification route 70L and the by-pass route 80L can be increased. In addition, the number of the output terminals of the power distributor 20 can be changed, and the power distributor 20 can be switched between a one-output type and a two-output type.

The high-frequency circuit 1A may further include the variable attenuators 45 and 46 disposed on the output route of the power distributor 20 in addition to the components in the high-frequency circuit 1.

With this configuration, the power (signal level) of a high-frequency signal outputted from the power distributor 20 can be adjusted.

The high-frequency circuit 1A may further include the variable attenuator 47 disposed between the nodes n3 and n2 on the by-pass route 80L in addition to the components in the high-frequency circuit 1.

With this configuration, the power (a signal level) of a high-frequency signal that transmits through the by-pass route 80L can be adjusted.

The power distributor 20 may include the differential inductor 21 and the resistance element 22 connected to the differential inductor 21.

With this configuration, the size can be reduced as compared with the case where power distribution is performed using a plurality of resistance elements. In the case of a configuration in the related art, the power loss of approximately 6 dB is generated. However, with the above configuration in which the differential inductor 21 is used, the power loss can be reduced to approximately 3 dB.

Other Embodiments

While high-frequency circuits according to an embodiment of the present disclosure have been described with reference to the embodiments, examples, and modifications, the present disclosure is not limited to the above-described embodiments, examples, and modifications. Another embodiment achieved by combining optional components in the above-described embodiments, examples, and modifications, a modification obtained by applying various variations made by those skilled in the art without departing from the scope of the present disclosure to the above-described embodiments, examples, and modifications, and various devices including the above-described high-frequency circuit are included in the present disclosure.

Furthermore, for example, in the high-frequency circuits according to the above-described embodiments, examples, and modifications, other circuit elements and other wiring lines may be inserted between the illustrated circuit elements and between the illustrated routes each connecting the signal routes.

An embodiment of the present disclosure is widely applicable to communication devices, such as cellular phones, as a high-frequency front-end circuit that meets the demand for miniaturization.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A high-frequency circuit comprising:
a signal input terminal;
an amplifier configured to amplify high-frequency signals input at the signal input terminal;
a power distributor that is in line with an output path of the amplifier and that is configured to perform power distribution on high-frequency signals;
a first by-pass path that bypasses the amplifier and that is configured to transmit high-frequency signals;
a second by-pass path that bypasses the power distributor and that is configured to transmit high-frequency signals;
a first switch and a second switch that are in line with the first by-pass path and that are configured to selectively allow transmission of high-frequency signals through the first by-pass path; and
a third switch that is in line with the second by-pass path and that is configured to selectively allow transmission of high-frequency signals through the second by-pass path,
wherein the first by-pass path is connected to a first node on a path connecting the signal input terminal to an input terminal of the amplifier, and a second node on a path connecting an output terminal of the amplifier to an input terminal of the power distributor, and
wherein the second by-pass path is connected to a third node that is between the first switch and the second switch and that is on the first by-pass path, and a fourth node on an output path of the power distributor.

2. The high-frequency circuit according to claim 1, further comprising an impedance conversion circuit between the first switch and the second switch in line with the first by-pass path.

3. The high-frequency circuit according to claim 2,
wherein the first switch is connected to the first node,
wherein the second switch is connected to the second node,
wherein the impedance conversion circuit is in line with a path connecting the first switch to the third node, and
wherein the impedance conversion circuit comprises a fourth switch configured to selectively switch between a first impedance state and a second impedance state.

4. The high-frequency circuit according to claim 3,
wherein the impedance conversion circuit further comprises an inductance element or a capacitance element, and
wherein the impedance conversion circuit does not comprise a resistance element.

5. The high-frequency circuit according to claim 4,
wherein the impedance conversion circuit further comprises a series arm circuit in line with the first by-pass path, and a parallel arm circuit in line with a path connecting a node on the first by-pass path to ground,
wherein the series arm circuit or the parallel arm circuit comprises an inductance element, and
wherein the other of the series arm circuit or the parallel arm circuit comprises a capacitance element and the fourth switch.

6. The high-frequency circuit according to claim 2, wherein the impedance conversion circuit comprises a transformer.

7. The high-frequency circuit according to claim 3, wherein the impedance conversion circuit further comprises a resistance element.

8. The high-frequency circuit according to claim 7,
wherein the resistance element is in line with the first by-pass path, and
wherein the fourth switch is connected in parallel with the resistance element.

9. The high-frequency circuit according to claim 7,
wherein the fourth switch is connected in series with the resistance element, and
wherein the resistance element and the fourth switch are each in line with a path connecting a node on the first by-pass path to ground.

10. The high-frequency circuit according to claim 1, further comprising a fifth switch in line with a path connecting the output terminal of the amplifier to the second node.

11. The high-frequency circuit according to claim 1, further comprising a sixth switch in line with a path connecting the first node to the input terminal of the amplifier.

12. The high-frequency circuit according to claim 1,
wherein the power distributor comprises a plurality of output terminals, and
wherein the high-frequency circuit further comprises a seventh switch in line with a path connecting any one of the output terminals of the power distributor to the fourth node.

13. The high-frequency circuit according to claim 1, further comprising a first variable attenuator in line with the output path of the power distributor.

14. The high-frequency circuit according to claim 1, further comprising a second variable attenuator between the third node and the second node and in line with the first by-pass path.

15. The high-frequency circuit according to claim 1, wherein the power distributor comprises a differential inductor and a resistance element connected to the differential inductor.

* * * * *